(12) United States Patent
Chen et al.

(10) Patent No.: US 6,861,858 B2
(45) Date of Patent: Mar. 1, 2005

(54) VERTICAL PROBE CARD AND METHOD FOR USING THE SAME

(75) Inventors: Hsing-Hsin Chen, Taipei Hsien (TW); Howard Hsu, San Jose, CA (US)

(73) Assignee: SCS Hightech, Inc., Taipei Hsien (TW)

( * ) Notice: Subject to any disclaimer, the term of this patent is extended or adjusted under 35 U.S.C. 154(b) by 31 days.

(21) Appl. No.: 10/351,096

(22) Filed: Jan. 23, 2003

(65) Prior Publication Data

US 2003/0141889 A1 Jul. 31, 2003

(30) Foreign Application Priority Data

Jan. 24, 2002 (TW) .......................... 91101112 A (51) Int. Cl.⁷ .............................................. G01R 31/02
(52) U.S. Cl. .................... 324/755; 324/761; 324/158.1; 324/754; 257/48
(58) Field of Search ................................ 324/755, 765, 324/754, 757, 761, 158.1, 763; 439/482, 700, 71; 257/737, 738; 438/48, 613, 614, 615; 228/180.22; 174/267, 260, 261; 361/722, 773, 774, 783

(56) References Cited

U.S. PATENT DOCUMENTS

| 5,477,160 A | * | 12/1995 | Love ........................... 324/755 |
| 5,831,441 A | * | 11/1998 | Motooka et al. ............. 324/754 |
| 6,130,546 A | | 10/2000 | Azizi |
| 6,174,744 B1 | | 1/2001 | Watanabe et al. |
| 6,292,003 B1 | * | 9/2001 | Fredrickson et al. ......... 324/754 |
| 6,616,966 B2 | * | 9/2003 | Mathieu et al. ............... 427/96 |

OTHER PUBLICATIONS

K. F. Greene, et al., "Flexible Contact Probe," IBM Technical Disclosure Bulletin, vol. 15, No. 5, p. 1513, Oct. 1972.

* cited by examiner

*Primary Examiner*—Kamand Cuneo
*Assistant Examiner*—Jimmy Nguyen
(74) *Attorney, Agent, or Firm*—Hogan & Hartson L.L.P.

(57) ABSTRACT

A vertical probe card for testing electronic devices includes a multi-layer ceramic substrate mounted on a printed circuit board. The multi-layer ceramic substrate provides a plurality of vertical probes arranged in a planar array and formed on the surface of the multi-layer ceramic substrate by microfabrication technology. The method of using the vertical probe card includes disposing a device to be tested under the card, aligning the card's probes with the I/O terminals of the device, and contacting the device with the card's ceramic substrate so that all of the contact portions of the I/O terminals are contacted and deformed by the probes. The relative positions of the electronic device and the apparatus are maintained while Automatic Test Equipment tests the device.

13 Claims, 6 Drawing Sheets

PRIOR ART

FIG. 4b

PRIOR ART

VERTICAL PROBE CARD AND METHOD FOR USING THE SAME

This application claims priority from Taiwanese patent application 91101112, filed Jan. 24, 2002, which application is incorporated by reference in its entirety.

BACKGROUND

1. Field of the Invention

The present invention relates to an apparatus and a method for testing electronic devices, especially for testing one or more dies on a integrated circuit (IC) wafer.

2. Description of the Related Art

Testing IC characteristics and the reliability of ICs is indispensable to the semiconductor industry. As IC manufacturing technology advances, ICs perform better and are able to work at higher frequencies with even smaller die sizes. The technology and equipment for IC testing needs to advance correspondingly. The number and density of the probes on a testing probe card should conform with those of the I/O terminals of the ICs to be tested. All the lines and leads from the probes to the Automatic Test Equipment (ATE) that generates and processes testing signals should be able to work at higher frequencies and maintain low noise to render accurate testing results. Besides, the cost of testing is an important component of the total cost of producing ICs. Therefore it is important to reduce the cost of testing.

Testing of an IC's characteristics and its reliability is carried out after the IC die has been packaged by sending and picking up test signals via the pins extending out of the IC package. Such a process does not sort out bad dies before packaging and thus wastes time and money when bad dies are packaged. Manufacturing wafers consumes the most time in the process of manufacturing IC products. In a traditional process flow the failure rate of the ICs is only known at the last stage. It is consequently normal to produce a number of surplus wafers at the first stage of IC production in anticipation of failures because it is generally not acceptable to start replacement wafer production when the IC failure rate is known. The result is that a manufacturer will keep a larger stock of wafers on hand, which increases costs.

Multi-chip modules have become more popular as advanced packaging technology has become available. In a multi-chip module any bad chip will result in the discard of the entire module. In a traditional process, testing is not done before the chips are packaged but is applied to the packaged multi-chip module. The testing thus experiences the greater complexity of the module and achieves less reliable results. The effect is higher testing costs, longer research and development cycles and costs, and a higher risk of returned goods. If individual dies were sorted before they were packaged, testing of the packaged multi-chip module would only need to identify damage caused by the packaging process, limiting the above-mentioned drawbacks.

Figure 1A:
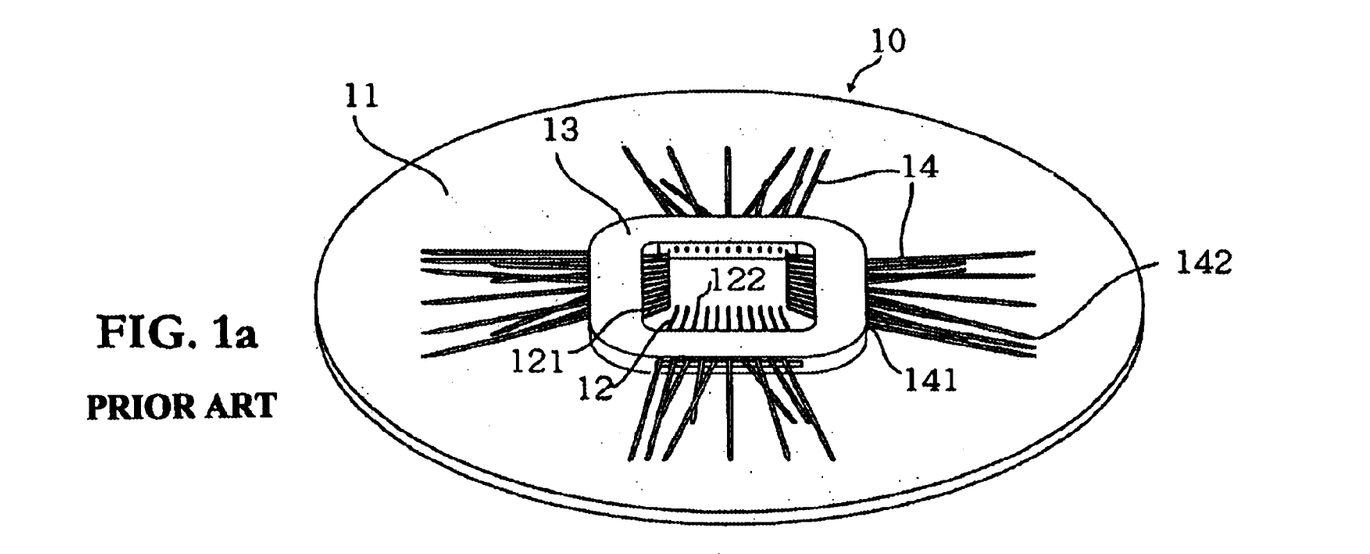
FIG. 1a is a perspective view of a conventional cantilever type probe card.
Figure 1B:
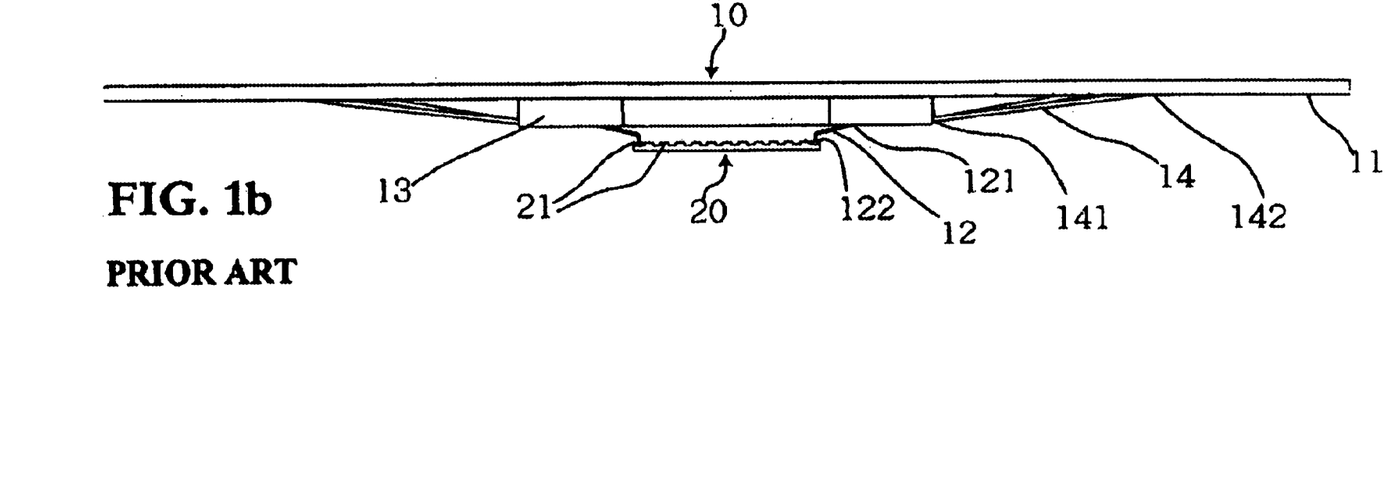

Wafer sort technologies which test individual dies within a completed integrated circuit wafer before packaging have been developed to address the problems associated with traditional IC testing technology. FIGS. 1a and 1b illustrate a conventional wafer sort apparatus that uses cantilever type probes. FIG. 1a shows the bottom side of a probe card 10 that includes a substrate 11 with a plurality of probes 12 mounted on the bottom side of the substrate 11. The probes 12 are arranged in a fan-shape with a first end 121 of each probe 12 extending through a resin plate 13. The resin plate 13 has an opening in its central portion and is tightly attached to the substrate 11 by adhesive. The arrangement of the probes 12 corresponds to the positions of the I/O terminals (bonding pads) 21 of the integrated circuit 20 to be tested, which is to be located under the probes 12. During testing the second ends 122 of the probes 12 are aligned to contact the I/O terminals 21. The substrate 11 has a plurality of leads 14 each having a first end 141 inserted in the resin plate 13 where the first end 141 is connected to the first end 121 of each probe 12. The second end 142 of each lead 14 extends outward and is soldered to the substrate 11. To provide connection with the testing circuits, the substrate 11 comprises a plurality of terminals (not shown in the figures) electrically linked to the leads 14 via electrical lines on the surface of and inside the substrate 11.

The illustrated probe card has several drawbacks. First, using this probe card to test a die requires that the bonding pads which act as the I/O terminals of the die be located only on the circumference of the die. Secondly, due to its structural strength requirement, the cantilever type probes 12 must be made relatively thick so that the density of the probes 12 is limited. Consequently the number of I/O terminals of the die to be tested is also limited or the die must be over-sized. Thirdly, cantilever type probe cards are disadvantageous for high frequency testing. Each probe 12 combined with lead 14 forms a 1~3 inch-long unshielded electric wire and these electric wires are closely spaced, substantially in parallel. This results in serious electromagnetic interference ("EMI") when high frequency test signals are applied. Moreover, the different length of these wires also causes impedance mismatches that are detrimental to high frequency access time testing.

Apart from the above-mentioned cantilever type probe cards, wafer sort apparatus of different designs have been disclosed, including the flexible membrane probe device described in "Flexible Contact Probe", IBM Technical Disclosure Bulletin, October 1972, page 1513. The device comprises a flexible dielectric film having terminals that are suited to making electrical contact with pads on integrated circuits. The terminals are connected to the flexible wires of the test electronics. The major problem of such a device is that the dimensional stability of the membrane is not sufficient to allow contacts to be made to pads on a full wafer during a burn-in temperature cycle.

SUMMARY OF THE PREFERRED EMBODIMENTS

An object of the present invention is to provide an apparatus and a method for testing dies on an integrated circuit wafer.

Another object of the present invention is to provide an apparatus and a method for testing dies on an integrated circuit wafer with more accurate results.

Still another object of the present invention is to provide an apparatus and a method for testing integrated circuit devices that are made in reduced sizes or with denser I/O terminals.

A further object of the present invention is to provide an apparatus and a method for testing integrated circuit devices that have I/O terminals not only on their circumference but also in central areas of the devices. Similarly, it is desirable for the testing apparatus and method be adapted to test devices that can be mounted on a printed circuit board using flip chip technologies.

A further object of the present invention is to provide an apparatus and a method that can test integrated circuit devices with very high frequency signals and still achieve accurate results.

An aspect of the invention provides a method for testing electronic devices, including providing a ceramic substrate comprising multiple layers of ceramic plates having vias and interconnecting vertical and horizontal conductive lines. The ceramic substrate has a first planar surface facing on an electronic device to be tested and a second planar surface opposing and parallel to the first planar surface. The ceramic substrate has a plurality of vertical probes mounted on and extends from the first planar surface of the ceramic substrate and a plurality of contactors on the second planar surface of the ceramic substrate. Each of the probes electrically connects to corresponding contactors through the vertical and horizontal conductive lines. The probes are aligned with I/O terminals of an electronic device to be tested and the electronic device and the probes are moved together until all of the I/O terminals of the electronic device are presumed to be in contact with corresponding probes. The method continues by moving the electronic device and the probes together by a presumed safety distance to ensure good contact of all the I/O terminals of the electronic device with the corresponding probes. The electronic device and the probes are held together until a testing process is complete.

A method for testing electronic devices, includes providing a test head comprising a ceramic substrate comprising multiple layers of ceramic plates having vias, the ceramic substrate having a first planar surface facing an electronic device to be tested and a second planar surface opposing and parallel to the first planar surface. The test head includes a plurality of vertical probes perpendicularly mounted on and extending from the first planar surface of the ceramic substrate. A plurality of contactors are provided on the second planar surface of the ceramic substrate and a plurality of vertical conductive lines are inserted in the vias of the layers of ceramic plates. A plurality of horizontal conductive lines are installed between the layers of ceramic plates, wherein at least one of the horizontal conductive lines connects to ground and each of the probes electrically connects to corresponding contactors through the horizontal conductive lines and the vertical conductive lines. An electronic device to be tested has I/O terminals that each comprises a contact portion that can be deformed when contacted by one of the probes substantially without deforming the I/O terminals. The probes are aligned with the I/O terminals of the electronic device. The electronic device is positioned with respect to the test head until all of the contact portions of the I/O terminals are contacted and deformed by the said probes. The electronic device is held until the testing process is completed.

How the foregoing objects are achieved will be discussed in the following with reference to the illustrating drawings, which form a part of the present disclosure.

BRIEF DESCRIPTION OF THE DRAWINGS

FIG. 1b is a cross-sectional view of the conventional cantilever type probe card shown in FIG. 1a.

DETAILED DESCRIPTION OF THE PREFERRED EMBODIMENTS

Figures 2A, 2B, 2C:
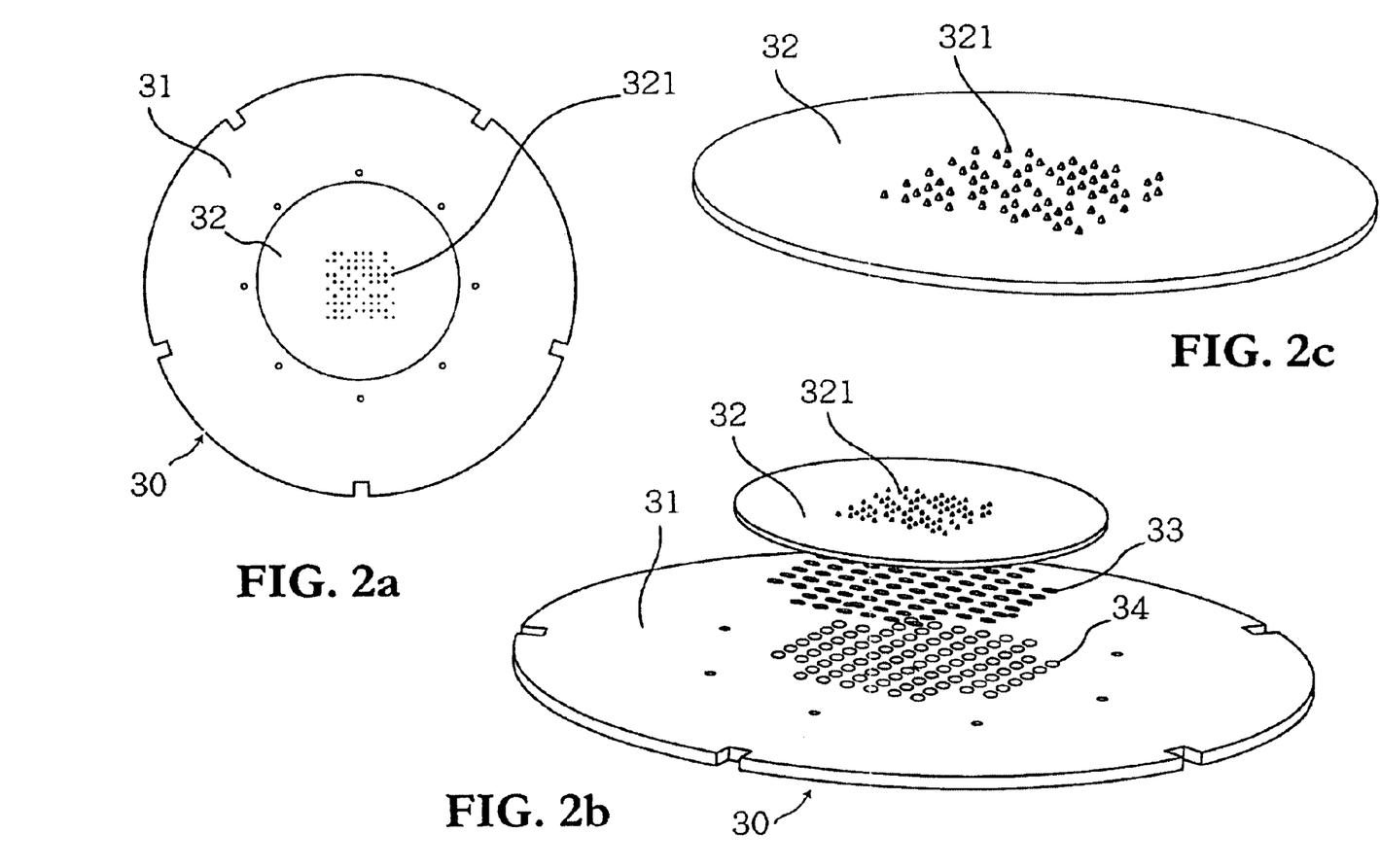
FIGS. 2a, 2b and 2c illustrate the bottom side of a vertical probe card according to the present invention.

FIG. 2a is a bottom view of a vertical probe card 30 according to an implementation of an aspect of the present invention. The vertical probe card 30 comprises a printed circuit board 31 with a multi-layer ceramic substrate 32 mounted on the central portion of the board 31. The multi-layer ceramic substrate 32 has an array of stiff vertical probes 321 on its bottom surface. FIG. 2b provides an exploded perspective view of the vertical probe card 30, showing that the multi-layer ceramic substrate 32 is soldered to the printed circuit board 31 through solder pads 33 and solder bumps 34 using surface mount technology. FIG. 2c is an enlarged perspective view showing the arrangement of the vertical probes 321 on the bottom surface of the multi-layer ceramic substrate 32.

Figure 3A:
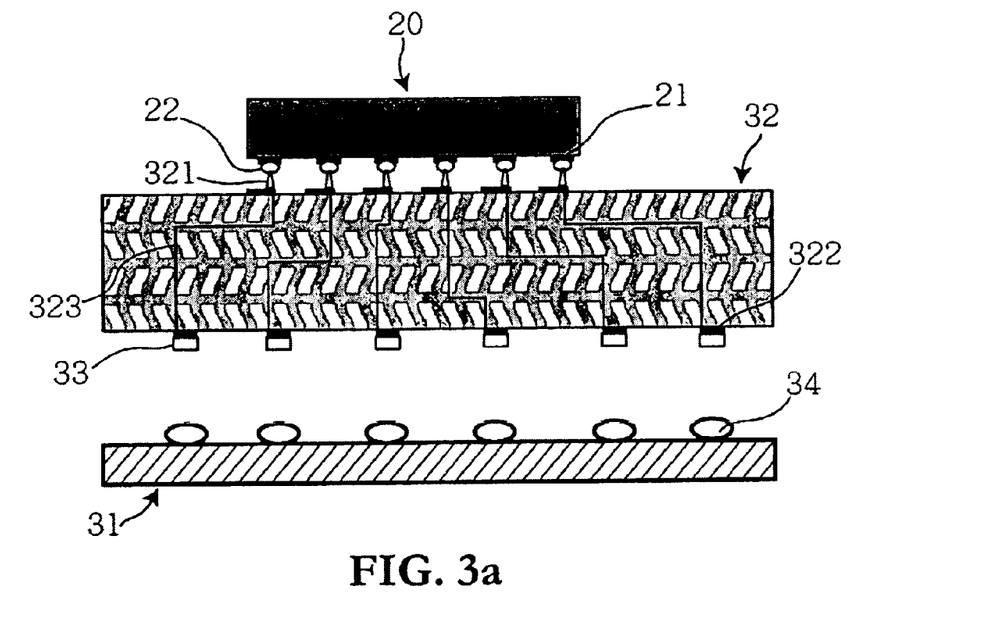
FIGS. 3a and 3b are cross-sectional views of the multi-layer ceramic substrate comprised in a vertical probe card according to the present invention.

Now referring to FIG. 3a, each solder pad 33 contacts a solder bump 34 to connect the bump through internal connections to a contactor 322 on the top surface of the multi-layer ceramic substrate 32. The illustrated structure electrically connects the printed circuit ("PC") board 31 to the probes 321 on the surface of the multi-layer ceramic substrate 32 through its internal lines 323. On the other side, the tips of the probes 321 contact the solder bumps 22 provided on the I/O terminals (bonding pads) 21 of the integrated circuit 20 to be tested.

Figure 3B:
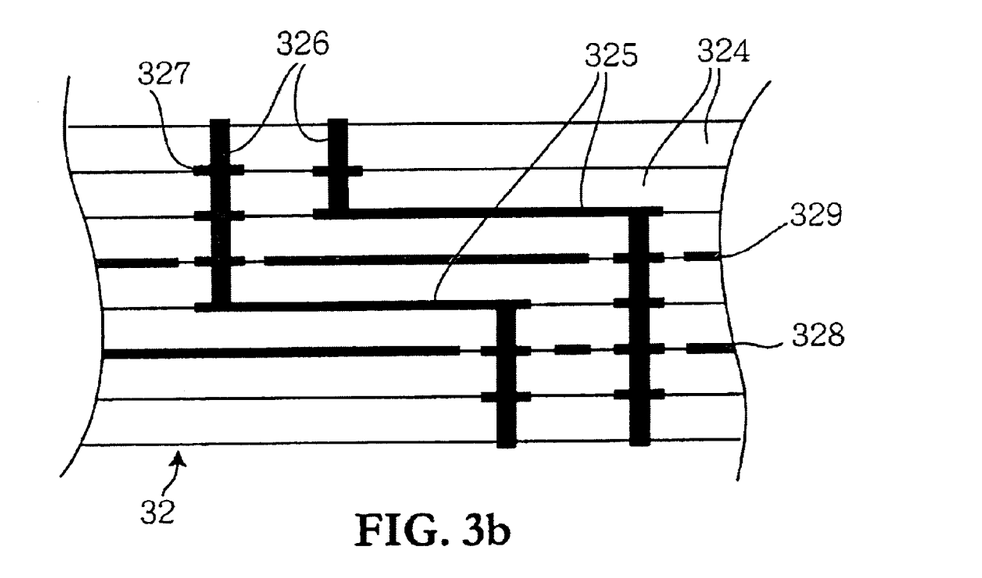

FIG. 3b illustrates the internal structure of the multi-layer ceramic substrate 32. The multi-layer ceramic substrate 32 comprises multiple layers 324 of ceramic plates. Each layer 324 is first bored and furnished with electrical lines. Then all the layers 324 are stacked and baked ("fired") in a furnace at a temperature around or slightly over 900° C. to form a single piece substrate using low temperature cofired ceramic ("LTCC") technology, as is known in the industry.

In the finished multi-layer ceramic substrate 32 there are horizontal lines 325 between the layers 324 and vertical conductive lines 326 extending through the vias bored in the layers 324. To compensate for inaccuracies in the location of the vias and reliably interconnect the vertical lines 326 in different layers 324, horizontal conductive pads 327 having areas greater than the cross-section of the vias are provided around the vias, between the layers 324.

Normally the vertical probes 321 on the surface of the ceramic substrate 32 are not formed at the same horizontal position as the vias. That is because the vias are made by machining so that the achievable minimum distance between two vias is far greater than the pitch of the I/O terminals 21 of the integrated circuit 20 to be tested. This is because the I/O terminals are made with wafer processing technology. Therefore, horizontal redistribution lines preferably are provided on the surface of the ceramic substrate 32 to connect the vertical probes 321 to the corresponding internal vertical lines 326. The horizontal lines 325 serve to magnify the smaller distances between the vias to the larger distances between the contactors 322 on the other side of the ceramic substrate 32 to facilitate their coupling to testing circuits, which are of a larger scale. Due to cost and mechanical strength considerations, the ceramic substrate 32 preferably is not made large enough for direct coupling to testing circuits, and a second magnification by horizontal lines in the printed circuit board 31 is preferably employed to facilitate connection to testing circuits. The horizontal lines 325 preferably are surrounded by Vsource lines 328 and ground lines 329 so that the EMI from testing current passing through the horizontal lines 325 and the vertical lines 326 can be filtered out. This same design is also applied to the structure of the printed circuit board 31 so the only unshielded lines remaining in the probe card 30 are the vertical probes 321 and the horizontal redistribution lines.

The vertical probes 321 on the surface of the ceramic substrate 32 are formed by photolithography and microfabrication techniques conventionally employed in wafer processing. Therefore the size and the pitch of the vertical probes 321 can be reduced to a very small scale. The difference between the pitch of the vertical probes 321 and that of the vias is relatively small so the lengths of the horizontal redistribution lines are limited. Therefore the overall EMI generated from the unshielded lines is very low. As a result, the probe card 30 is suitable and advantageous for very high frequency testing.

0.13 micron process technology is becoming mainstream in current production of semiconductors. As the semiconductor manufacturing technology advances, the size of the transistors in an integrated circuit device has been reduced and individual IC devices contain more and more transistors and have more and more functions. As a consequence, the number of I/O terminals for an IC is typically increased. Traditional designs in which the I/O terminals are arranged in two rows or along the four edges of a die cannot meet the newest demands. Flip chip technology has been developed in response to the need for additional I/O terminals. Flip chip technology provides I/O terminals for an IC in an array over one surface of the IC and the I/O terminals are provided with solder bumps on them for mounting the IC to a PC board. In the past few years, IC packaging technology has evolved from QFP, to BGA, then to μBGA and now to wafer level packaging. The I/O terminals of an IC are thus not limited to the borders of the chip any more but may be arranged as an array of multiple columns and multiple rows arranged over a surface. Another factor which favors flip chip technology is that it can reduce EMI and thus facilitates higher frequency applications.

Figure 4A:
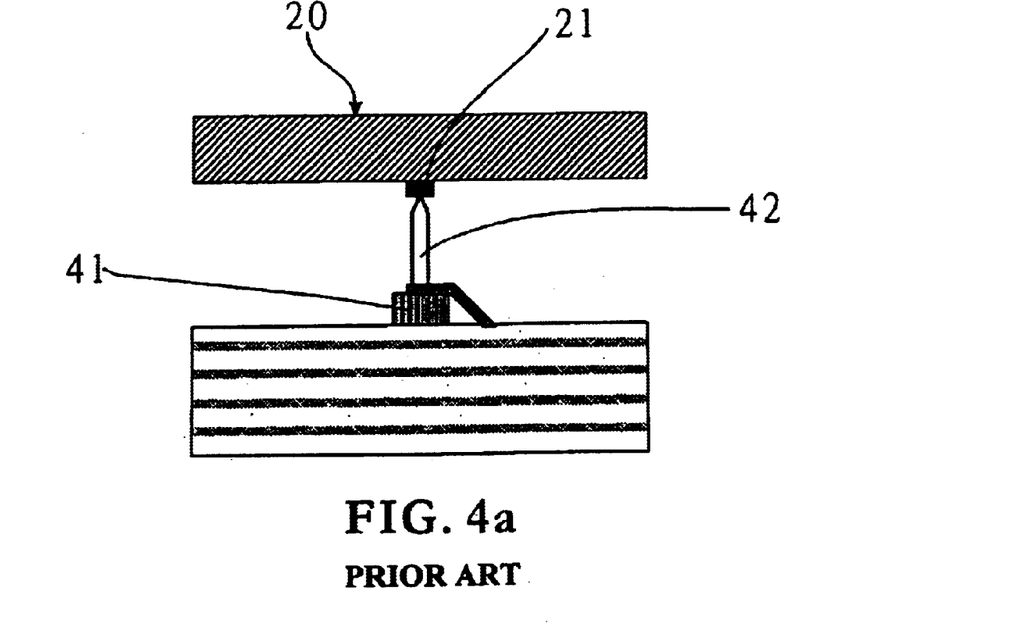
FIGS. 4a and 4b depict a conventional probe with a flexible structure.
Figure 4B:
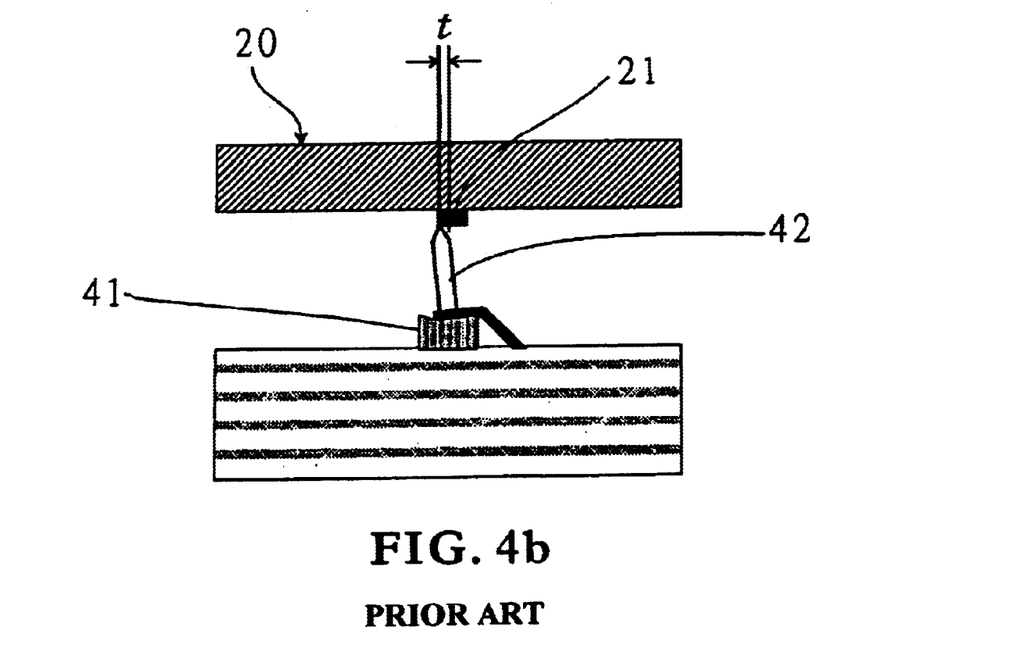

A vertical probe card 30 according to the present invention is especially suitable for testing ICs having flip chip technology I/O terminals. To accommodate the variation in the height of the I/O terminals of an IC to be tested, each probe of most conventional wafer sort devices contains a resilient structure. FIG. 4a illustrates an exemplary probe 42 which is mounted on a resilient pad 41. When the probe 42 is forced by pressure to contact an I/O terminal 21 of an IC under test, it may be tilted and a horizontal displacement t of its tip may occur as shown in FIG. 4b. The horizontal displacement t may cause poor contact between a probe 42 and its corresponding I/O terminal 21 of an IC under test, which could produce faulty test data and may cause one to conclude that a good IC is bad.

Figure 5A:
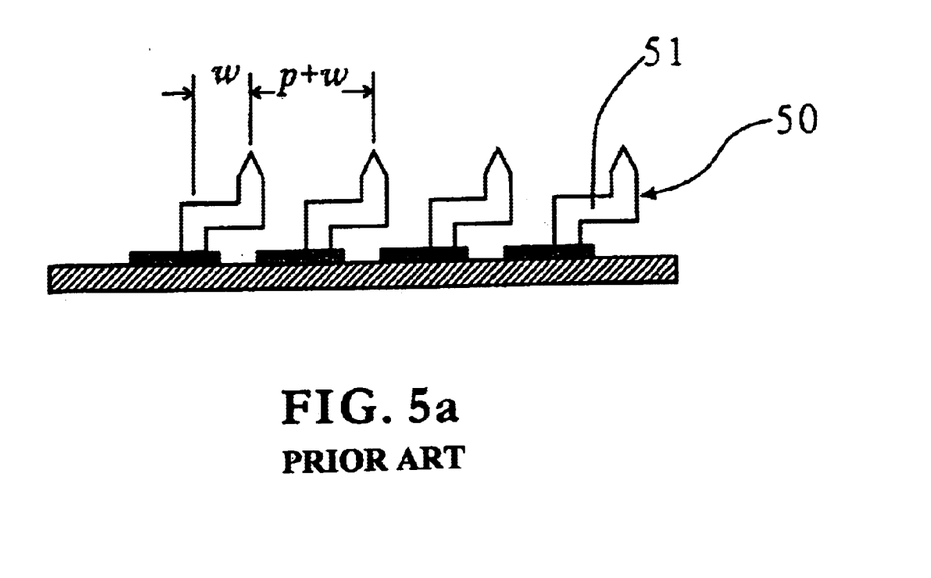
FIG. 5a is a cross-sectional view of the arrangement of another conventional probe having a flexible structure.
Figure 5B:
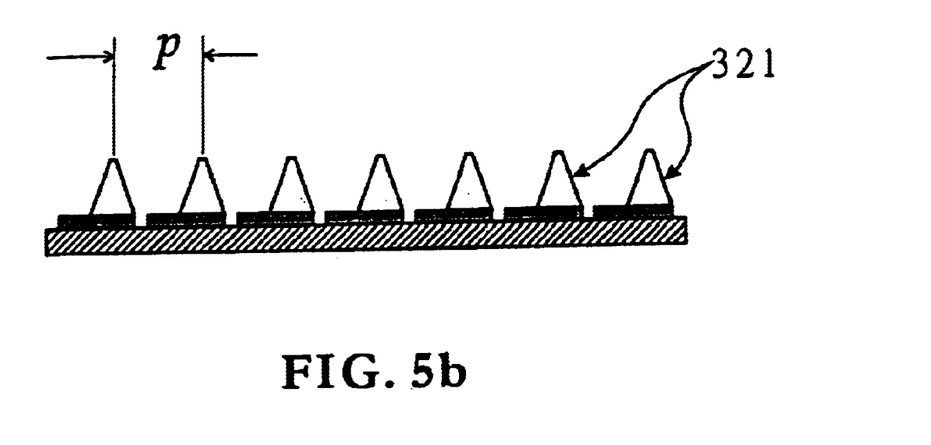
FIG. 5b is a cross-sectional view of the arrangement of vertical probes in accordance with the present invention.

FIG. 5a shows another conventional probe 50 with a resilient structure, as described in U.S. Pat. No. 6,218,203. The probe 50 comprises a horizontal beam 51 in its middle portion. It uses the same principle as the cantilever type probe 12 described above, which is converting flexural deformation of the horizontal beam 51 into vertical displacement of the tip of the probe 50. The probe 50 not only has the above-mentioned drawbacks of the probe 42 but also is apt to come off the substrate to which it is attached by the torque applied to the horizontal beam 51 from contact pressure during testing. In addition, this design undesirably enlarges the pitch of the probes 50. FIG. 5b shows the cross-section of a row of vertical probes 321 in accordance with a preferred embodiment of the present invention. By comparing FIG. 5a and FIG. 5b, it is clear that the minimum pitch of the resilient probes 50 exceeds or equals the minimum pitch p of the vertical probes 321 plus the width w of the horizontal beam 51 of the resilient probes 50.

Ceramics are preferred as the materials for the multi-layer substrate 32 which supports the vertical probes 321 and embraces the horizontal lines 325 for several reasons:

1. The physical properties of appropriate ceramics are similar to those of silicon. Both can endure high temperature without unacceptable deformation. The coefficient of expansion of the ceramic can be selected to be close to that of silicon, therefore precise alignment of the vertical probes 321 with corresponding I/O terminals 21 of the integrated circuit 20 under test can be maintained during burn-in testing where temperature is high.
2. Ceramics can be selected that have a low dielectric constant, which helps to avoid capacitive coupling between internal leads.
3. Ceramic has very high stiffness and can maintain high flatness after it has been repeatedly heated during a long period.

Thanks to these properties and the fact that the vertical probes 321 are very short and perpendicularly fixed to the ceramic substrate 32, the vertical probes 321 are hard to bias or deflect and thus have a long duty life. By contrast, substrates of less stiff or lower heat-enduring materials, and resilient probes are susceptible to creep and fatigue that may result in short life duty.

Figure 6A:
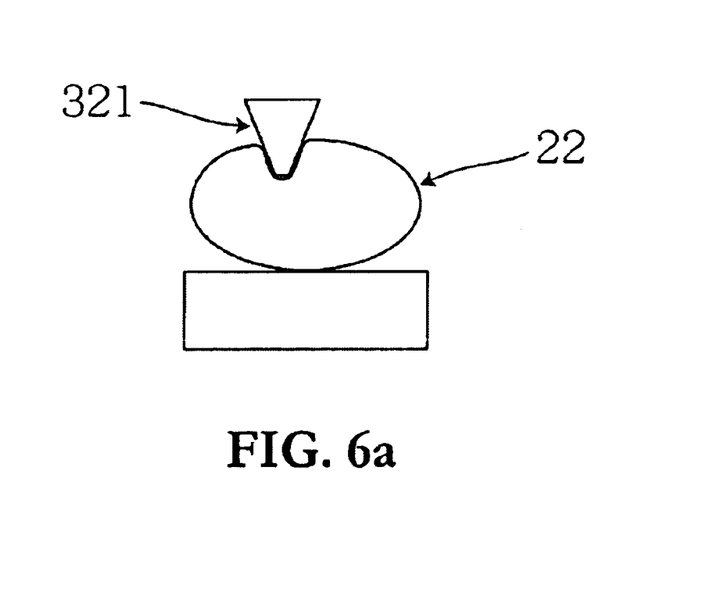
FIG. 6a is an enlarged view illustrating a vertical probe in accordance with the present invention in contact with the solder bump on a contact pad of the integrated circuit device to be tested.
Figure 6B:
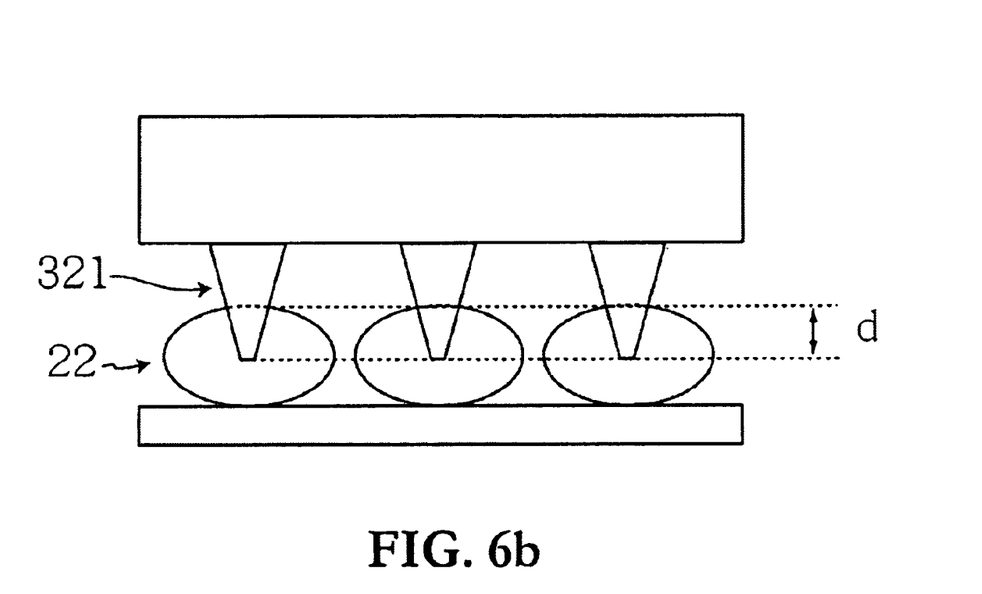
FIG. 6b shows the relative positions of the vertical probe card in accordance with the present invention and the tested integrated circuit device when all of the probes are in contact with corresponding solder bumps on the contact pads of the integrated circuit device to be tested.

Preferred embodiments of the present invention adopt for the probe card 30 an entirely rigid structure, ensuring proper contact between the probe card 30 and the I/O terminals 21 of the IC 20 under test. Preferably the material on the IC side in contact with the vertical probes 321 is selected to be softer or more flexible than the vertical probes 321 to a certain degree. Such material is preferably selected to allow certain plastic or flexural deformation to adapt to the disposition and the shapes of the vertical probes 321. A preferable solution is to apply solder bumps on the bonding pads, as is being widely practiced for final assembly in the industry. Appropriate plastic deformation of the solder bumps on the bonding pads to adapt to the disposition and the shapes of the tips of the probes 321 most preferably occurs when the latter are pressed to contact the bumps. FIG. 6a illustrates a solder bump 22 contacted by a vertical probe 321. The near central upper portion of the solder bump 22 is depressed by the tip of the probe 321. The shape of the depression matches that of the tip of the probe 321. In FIG. 6a the probe 321 is slightly horizontally misaligned to the solder bump 22 and does not extend exactly into the central outer portion of the solder bump 22. Nevertheless this still constitutes a good electrical contact due to the matching interface between the two parts. The probes 321 are preferably taper-shaped to obtain higher structural strength while being apt to penetrate the solder bumps 22.

During testing, the probe card 30 is installed with the probes 321 facing down at an appropriate location in the probing apparatus. The wafers containing the ICs 20 to be tested are moved one by one to beneath the probe card 30 by automatic conveying means. Then the probe card 30 is horizontally (moved along x and y axis) aligned to the IC(s) 20 to be tested on the wafer beneath the probe card 30. The wafer is then lifted up until all the probes 321 contact the corresponding I/O terminals 21 of the IC(s) 20 under test. This method is characterised in that the material on the IC side in contact with the vertical probes 321 preferably is softer or more flexible than the vertical probes 321 and the wafer containing the IC(s) 20 to be tested preferably is lifted up to an appropriate elevation (z axis) where the estimated average elevation of the summits of the I/O terminals 21 (including the solder bumps 22 if applicable) of the IC(s) 20 under test, provided they were not deformed by the probes 321, is higher than the estimated average elevation of the tips of the vertical probes 321 by a certain length. In the circumstances where each I/O terminal 21 contains a solder bump 22, the estimated average elevation of the top point of the solder bumps 22 is preferably higher than the estimated average elevation of the tips of the vertical probes 321 by about 5~25 $\mu$m. Please refer to FIG. 6a, where the preferred height difference is expressed by "d".

Preferred implementations of the present invention provide a precise and durable probing device that can be used to repeatedly and reliably probe numerous ICs. These advantages preferably are achieved by providing a ceramic substrate 32 which has high stiffness and flatness under a wide range of temperatures and has multi-layer structures to contain internal redistribution lines with EMI filtering conductive lines, and by forming the probes 321 with a simple and strong structure preferably perpendicularly fixed on the substrate 32 with very fine pitch defined using photolithography technology. The durability of the probing device is further enhanced by utilizing a soft or resilient structure for contacting the probing device to the ICs.

Application of the present invention is not limited to probing ICs on a semiconductor wafer. Other applications include testing of assembled printed circuit boards, the conductive films of the driver circuit of an LCD screen and so on.

The present invention has been described in terms of certain preferred embodiments thereof. Those of ordinary skill in the art will appreciate that various modifications might be made to the embodiments described here without varying from the basic teachings of the present invention. Consequently the present invention is not to be limited to the particularly described embodiments but instead is to be construed according to the claims, which follow.

We claim:

1. A method for testing electronic devices, comprising:
   providing a ceramic substrate comprising multiple layers of ceramic plates having vias and interconnecting vertical and horizontal conductive lines, the ceramic substrate having a first planar surface facing on an electronic device to be tested and a second planar surface opposing and parallel to the first planar surface, the ceramic substrate having a plurality of vertical probes mounted on and extending from the first planar surface of the ceramic substrate and a plurality of contactors on the second planar surface of the ceramic substrate, wherein each of the probes electrically connects to corresponding contactors through the vertical and horizontal conductive lines;
   aligning the probes with I/O terminals of an electronic device to be tested;
   moving the electronic device and the probes together until all of the I/O terminals of the electronic device are presumed to be in contact with corresponding probes;
   continuing moving the electronic device and the probes together by a presumed safety distance to ensure good contact of all the I/O terminals of the electronic device with the corresponding probes; and
   holding the electronic device and the probes together until a testing process is complete.

2. The method of claim 1, wherein the I/O terminals of the electronic device are positioned in presumed contact with the corresponding probes by previously measuring an average height of the I/O terminals of the electronic device and a height of the probes and relative positions of the I/O terminals and the probes in a testing apparatus and wherein the safety distance has been obtained by previous experiments to ensure good contact between the probes and the I/O terminals without functionally damaging the I/O terminals.

3. The method of claim 1, wherein the probes consist essentially of one or more metals selected from the group including tungsten, rhodium, chromium, iridium, nickel and rhenium.

4. The method of claim 1, wherein the probes have tapered tips.

5. The method of claim 1, wherein the probes are arranged in a planar array including a circumferential portion surrounding a central portion.

6. The method of claim 1, wherein each of the I/O terminals of the electronic device comprises a contact portion which can be deformed when contacted by any of the probes substantially without causing deformation of the probes.

7. The method of claim 6, wherein the contact portion is a solder bump.

8. The method of claim 7, wherein the safety distance is between 5 to 25 $\mu$m.

9. The method of claim 1, wherein a printed circuit board is mechanically and electrically connected to automatic test equipment and the ceramic substrate is mounted on and electrically coupled to the printed circuit board.

10. The method of claim 9, wherein the ceramic substrate is electrically coupled to the printed circuit board by surface mount technology.

11. A method for testing electronic devices, including:
   (1) providing a test head comprising:
      a ceramic substrate comprising multiple layers of ceramic plates having vias, the ceramic substrate having a first planar surface facing an electronic device to be tested and a second planar surface opposing and parallel to the first planar surface,
      a plurality of vertical probes perpendicularly mounted on and extending from the first planar surface of the ceramic substrate,
      a plurality of contactors on the second planar surface of the ceramic substrate,
      a plurality of vertical conductive lines inserted in the vias of the layers of ceramic plates, and
      a plurality of horizontal conductive lines installed between the layers of ceramic plates, wherein at least one of the horizontal conductive lines connects to ground, wherein each of the probes electrically connects to corresponding contactors through the horizontal conductive lines and the vertical conductive lines;
   (2) providing an electronic device to be tested having I/O terminals that each comprises a contact portion that can be deformed when contacted by one of the probes substantially without deforming the I/O terminals;
   (3) aligning the probes with the I/O terminals of the electronic device;

(4) positioning the electronic device with respect to the test head until all of the contact portions of the I/O terminals are contacted and deformed by the said probes; and (5) holding the electronic device until the testing process is completed.

12. The method of claim 11, wherein the contact portions of the I/O terminals are plastically deformed by the probes.

13. The method of claim 12, wherein the contact portions of the I/O terminals are solder bumps.

* * * * *